(12) United States Patent
Kimura

(10) Patent No.: US 8,686,794 B2
(45) Date of Patent: Apr. 1, 2014

(54) AMPLIFYING APPARATUS

(71) Applicant: Fujitsu Limited, Kawasaki (JP)

(72) Inventor: Shigekazu Kimura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/898,021

(22) Filed: May 20, 2013

(65) Prior Publication Data

US 2013/0249638 A1    Sep. 26, 2013

Related U.S. Application Data

(63) Continuation of application No. PCT/JP2010/073041, filed on Dec. 21, 2010.

(51) Int. Cl.
*H03F 3/68* (2006.01)

(52) U.S. Cl.
USPC ........................................ 330/295; 330/124 R

(58) Field of Classification Search
USPC .................. 330/295, 124 R, 53, 84, 286, 289
See application file for complete search history.

(56) References Cited

U.S. PATENT DOCUMENTS

| | | | |
|---|---|---|---|
| 5,345,189 A | 9/1994 | Hornak et al. | |
| 6,825,719 B1 | 11/2004 | Barak et al. | |
| 6,864,742 B2* | 3/2005 | Kobayashi | 330/124 R |
| 7,646,248 B2* | 1/2010 | Yang et al. | 330/295 |
| 7,688,135 B2* | 3/2010 | Kim et al. | 330/124 R |
| 2010/0189193 A1 | 7/2010 | Miura | |
| 2010/0244949 A1 | 9/2010 | Gustavsson et al. | |

FOREIGN PATENT DOCUMENTS

| | | |
|---|---|---|
| JP | 7-131278 | 5/1995 |
| JP | 2008-135829 | 6/2008 |
| JP | 2009-130897 | 6/2009 |
| JP | 2009-182397 | 8/2009 |
| WO | 2007/084033 | 7/2007 |
| WO | 2008-023414 | 2/2008 |
| WO | 2008-044268 | 4/2008 |

OTHER PUBLICATIONS

International Search Report mailed Mar. 1, 2011 in corresponding International Application No. PCT/JP2010/073041.
PCT Preliminary Report on Patentability mailed Jul. 4, 2013 in corresponding International Application No. PCT/JP2010/073041.
European Search Report issued on Sep. 19, 2013 in corresponding European Application No. 10861078.3.

(Continued)

*Primary Examiner* — Hieu Nguyen
(74) *Attorney, Agent, or Firm* — Staas & Halsey LLP

(57) ABSTRACT

An amplifying apparatus includes a first amplifier that amplifies a first signal of a constant amplitude; a second amplifier that amplifies a second signal identical in amplitude and differing in phase with respect to the first signal; a first transmission line of which, a first end is connected to an output terminal of the first amplifier; a second transmission line differing in length with respect to the first transmission line and of which, a first end is connected to an output terminal of the second amplifier and a second end is connected to a second end of the first transmission line; and an amplitude balance adjusting element connected to the first or the second transmission line. The amplifying apparatus outputs from a connection node of the first and the second transmission lines, a signal that is a combination of output signals of the first amplifier and of the second amplifier.

2 Claims, 5 Drawing Sheets

(56) References Cited

OTHER PUBLICATIONS

El-Asmar et al: "Improving Chireix Efficiency Using MEMS Switches", Electrical and Computer Engineering, Canadian Conference on, IEEE, PI, May 1, 2013, pp. 2310-2313, XP031004615, ISBN: 978-1-4244-00-38-6.

Ampem-Darko S. et al: "Gain/Phase Imbalance Cancellation Technique in LINC Transmitters", Electronics Letters, IEE Stevenage, GB, vol. 34, No. 22, Oct. 29, 1998, pp. 2093-2094, XP006010490, ISSN: 0013-5194, DOI: 10.1049/EL:19981432.

* cited by examiner

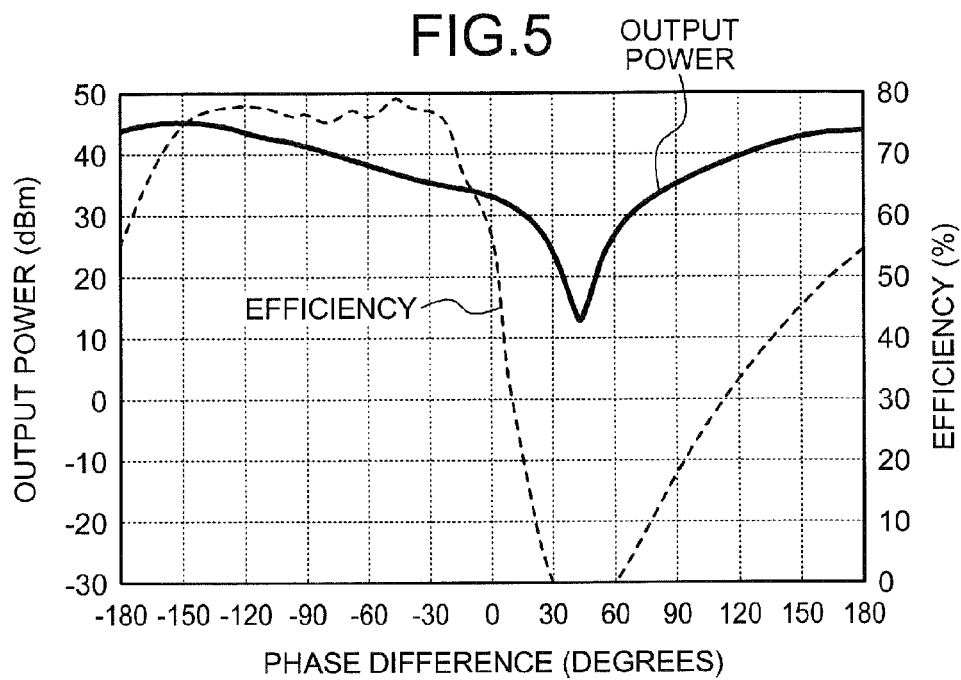
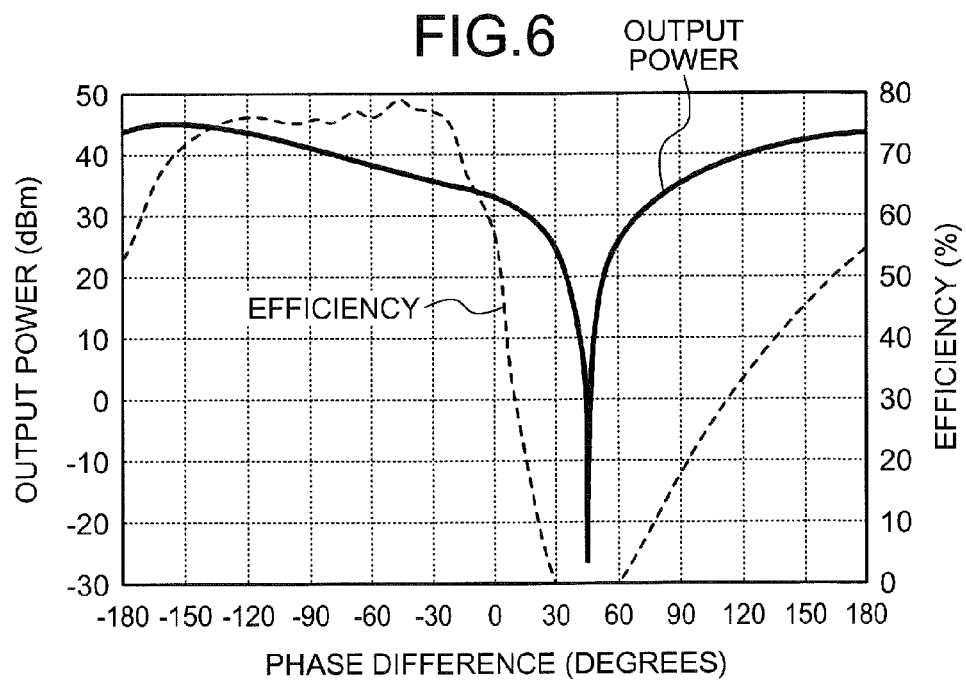

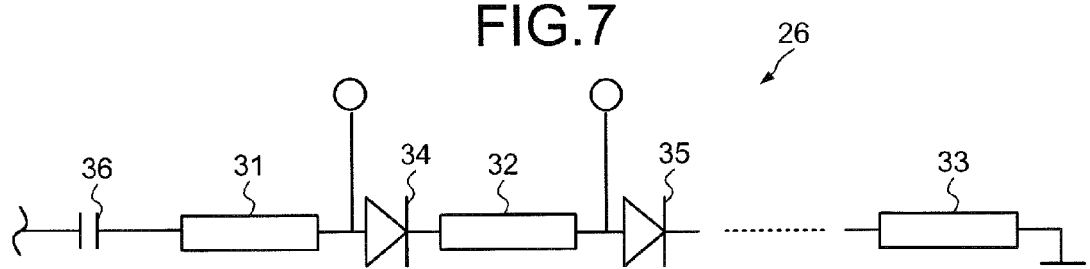
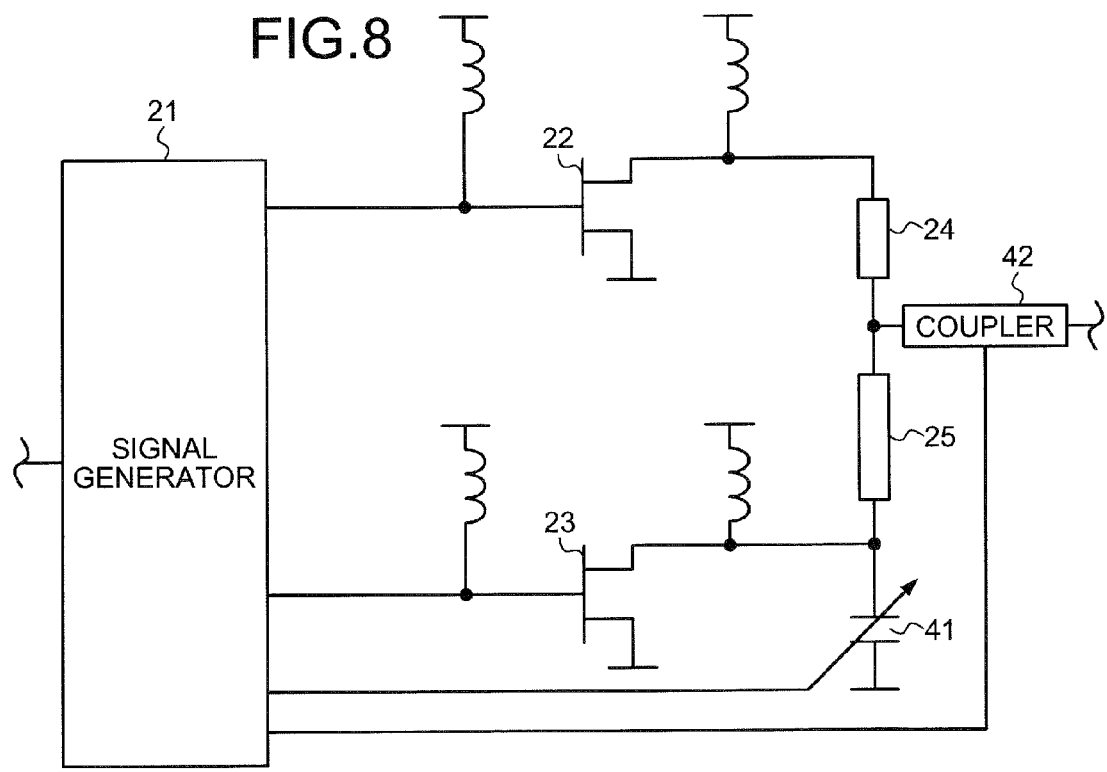

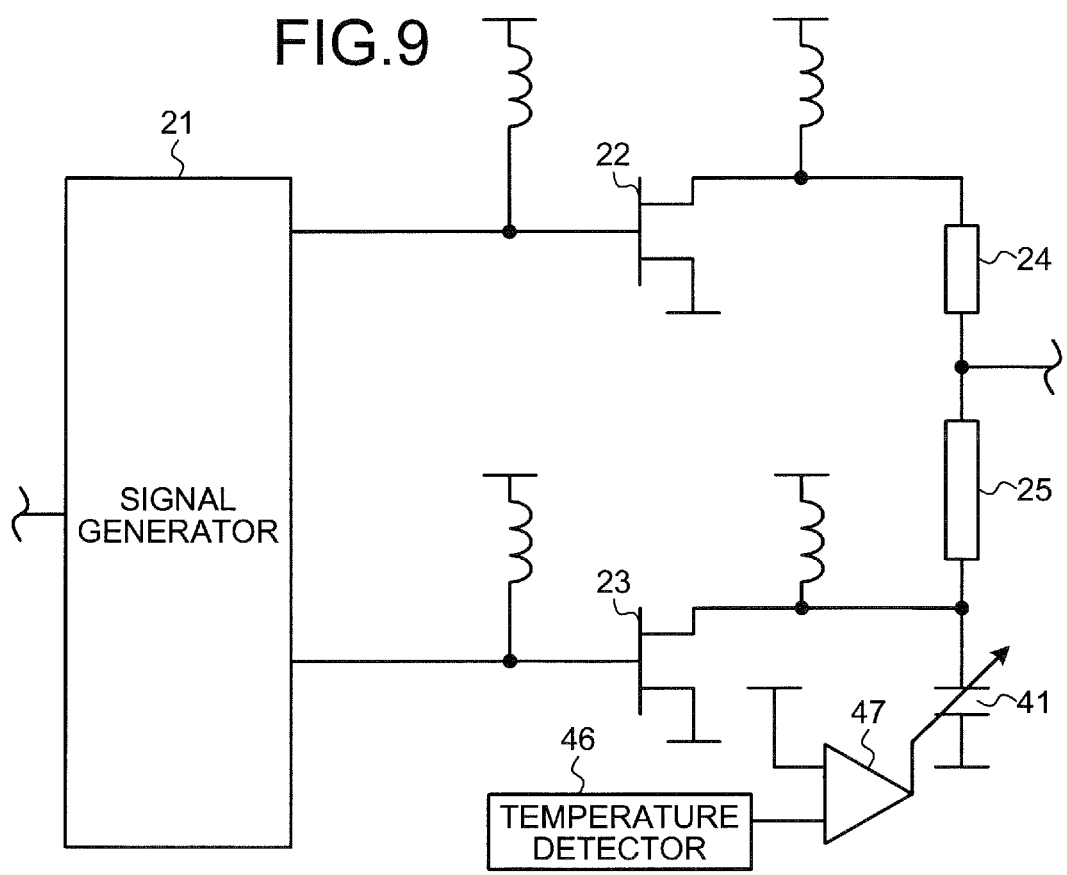

AMPLIFYING APPARATUS

CROSS REFERENCE TO RELATED APPLICATIONS

This application is a continuation application of International Application PCT/JP2010/073041, filed on Dec. 21, 2010 and designating the U.S., the entire contents of which are incorporated herein by reference.

FIELD

The embodiments discussed herein are related to an amplifying apparatus.

BACKGROUND

One highly efficient linear amplifying apparatus is a high frequency amplifying apparatus that uses a saturated amplifier employing Linear Amplification with Nonlinear Components (LINC). Conventionally, such amplifying apparatuses include a pair of amplifiers and a coupler, where signals output from the amplifiers are combined by the coupler and output. A hybrid coupler or a 3 dB coupler is used.

One conventional amplifying apparatus divides a high frequency signal into 2 signals identical in amplitude and differing in phase, amplifies the resulting signals, transmits the amplified signals by transmission paths having a length of $\lambda/4$, and combines the signals. In the amplifying apparatus, a $\lambda/8$ open stub is connected to one transmission path and a $3\lambda/8$ open stub is connected to the other transmission path. In another amplifying apparatus, 2 transmission paths respectively having a filtering property are connected by a filter circuit positioned an equal distance from amplifiers that are respectively disposed upstream of the transmission paths. In yet another amplifying device, multiple capacitors and switching circuits for frequency matching are disposed at the secondary side of the output transformer of the amplifier and by switching between the switching circuits, a capacitor at the secondary side of the output transformer is selected. In addition, another apparatus is configured by pure inductive circuit elements and the apparatus combines 2 signals identical in frequency and differing in phase, and generates a signal that is proportional to the sum or difference of the 2 signals.

For examples of conventional technologies refer to Japanese Laid-Open Patent Publication Nos. 2008-135829; 2009-182397; 2009-130897; and H7-131278.
Japanese Laid-Open Patent Nonetheless, with conventional amplifiers, when signals are combined by a coupler such as a hybrid or 3 dB coupler, a loss of 3 dB occurs. On the other hand, when a pair of amplifiers is coupled by a coupler without coupler isolation such that a suitable effect with respect to the respective loads of the amplifiers is achieved, efficiency can be maintained over a wider dynamic range as compared to a conventional amplifier.

FIG. 1 is a diagram of an amplifying apparatus employing a coupler without coupler isolation. The amplifying apparatus depicted in FIG. 1 includes transmission lines 4 and 5 of differing lengths, as a coupler without coupler isolation. The amplifying apparatus generates uses a signal generator 1 to generate from an input signal with a varying envelope, a pair of signals constant in amplitude and differing in phase, amplifies the signals output from the signal generator 1 by amplifiers 2 and 3, and then combines for output, the signals output from the amplifiers 2 and 3 by the transmission lines 4 and 5.

Nonetheless, with an amplifying apparatus such as that depicted in FIG. 1, when the pair of amplifiers is coupled to maintain efficiency over a wide dynamic range, the dynamic range of the amplitude of the output power of the coupler is significantly narrower than desired. In other words, the amplitude modulation of the signal input to the amplifying apparatus cannot be reproduced.

With respect to the output power of the amplifying apparatus, an imbalance of the amplitudes of the signals input to the pair of amplifiers can be considered as one cause of the inability to reproduce the amplitude modulation. Therefore, by independently adjusting the amplitudes of the signals input to the pair of amplifiers, the amplitudes could be balanced theoretically. However, for example, in an amplifying apparatus that, similar to an amplifying apparatus employing LINC, uses the amplifier in a saturated state to improve efficiency, even if the amplitude of the signal input to the amplifier is increased, the power out from the amplifier does not substantially change. On the other hand, if the amplitude of the signal input to the amplifier is decreased, the amplifier no longer operates in a saturated state and thus, efficiency deteriorates.

SUMMARY

According to an aspect of an embodiment, an amplifying apparatus includes a first amplifier that amplifies a first signal of a constant amplitude; a second amplifier that amplifies a second signal identical in amplitude and differing in phase with respect to the first signal; a first transmission line of which, a first end is connected to an output terminal of the first amplifier; a second transmission line differing in length with respect to the first transmission line and of which, a first end is connected to an output terminal of the second amplifier and a second end is connected to a second end of the first transmission line; and an amplitude balance adjusting element that is connected to any one among the first transmission line and the second transmission line. The amplifying apparatus outputs from a connection node of the first transmission line and the second transmission line, a signal that is a combination of an output signal of the first amplifier and an output signal of the second amplifier.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 5 and 6 are diagrams depicting simulation results of the amplifying apparatus according to the second embodiment;

FIG. 7 is a diagram of an example of main parts of the amplifying apparatus according to the second embodiment;

FIG. 8 is a diagram of the amplifying apparatus according to a third embodiment; and FIG. 9 is a diagram of the amplifying apparatus according to a fourth embodiment.

DESCRIPTION OF EMBODIMENTS

Embodiments of an amplifying apparatus according to the present invention will be described in detail with reference to the accompanying drawings. The amplifying apparatus has an amplitude balance adjusting element connected to a first transmission line or a second transmission line. The first transmission line and the second transmission line are connected in series between output terminals of a pair of amplifiers. Nonetheless, the invention is not limited to this embodiment.

Figure 1:
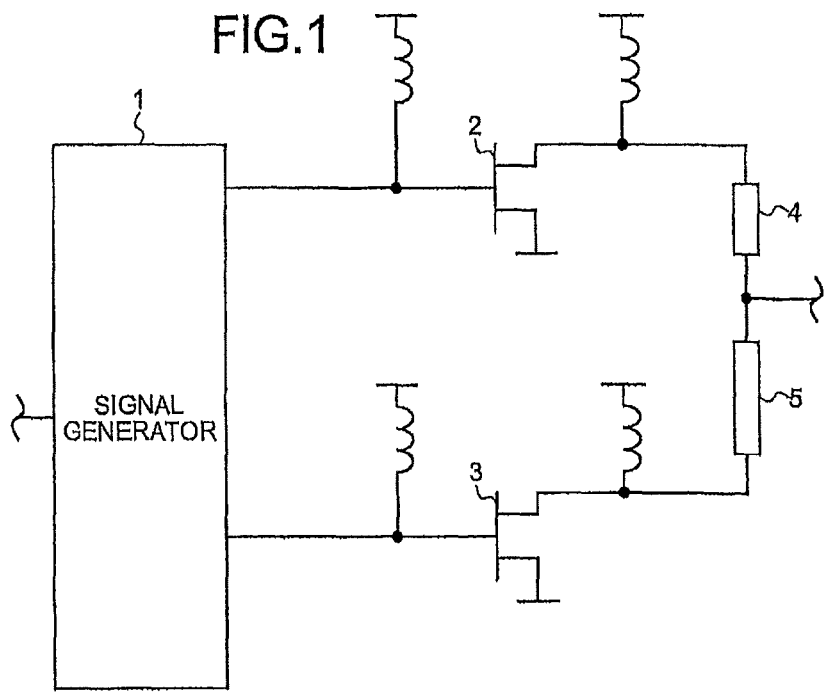
FIG. 1 is a diagram of an amplifying apparatus employing a coupler without coupler isolation.
Figure 2:
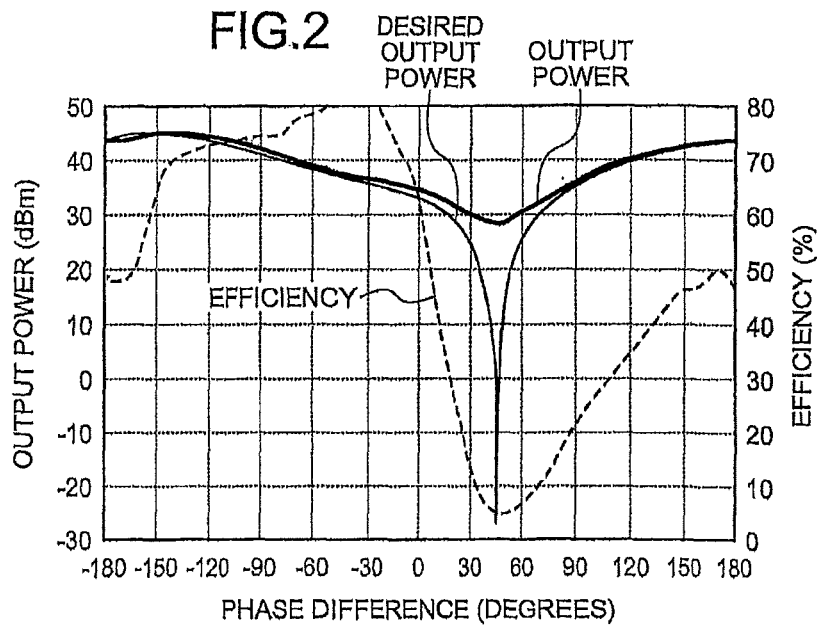
FIG. 2 is a diagram depicting efficiency and amplitude simulation results for an amplifying apparatus employing a coupler without coupler isolation.

FIG. 2 is a diagram depicting efficiency and amplitude simulation results for an amplifying apparatus employing a coupler without coupler isolation. In this amplifying apparatus, the pair of amplifiers is coupled such that efficiency is maintained over a wide dynamic range. As depicted in FIG. 2, the dynamic range (in FIG. 2, "output power") of the amplitude of the power output from the coupler is significantly narrower than desirable (in FIG. 2, "desired output power").

Figure 3:
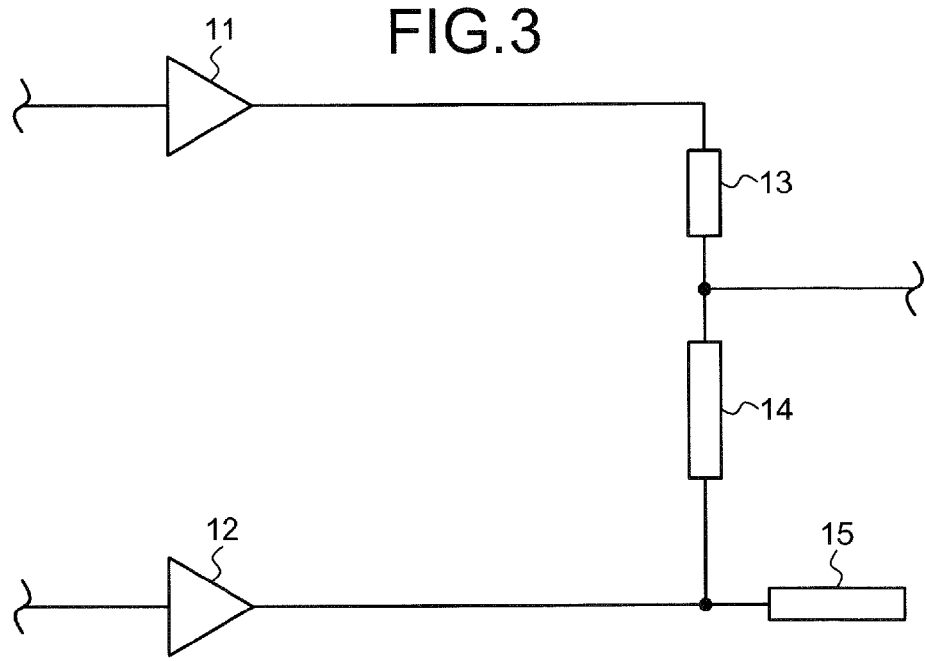
FIG. 3 is a diagram of an amplifying apparatus according to a first embodiment.

FIG. 3 is a diagram of the amplifying apparatus according to a first embodiment. As depicted in FIG. 3, the amplifying apparatus includes a first amplifier 11, a second amplifier 12, a first transmission line 13, a second transmission line 14, and an amplitude balance adjusting element 15. The first amplifier 11 amplifies a first signal. The amplitude of the first signal is constant. The second amplifier 12 amplifies a second signal. The second signal is identical in amplitude but differs in phase with respect to first signal.

One end of the first transmission line 13 is connected to an output terminal of the first amplifier 11. One end of the second transmission line 14 is connected to an output terminal of the second amplifier 12. The other end of the second transmission line 14 is connected to the other end of the first transmission line 13. The first transmission line 13 and the second transmission line 14 are of differing lengths.

The amplitude balance adjusting element 15 is connected to any one of the first transmission line 13 and the second transmission line 14. In the example depicted in FIG. 3, the amplitude balance adjusting element 15 is connected to the second transmission line 14. The amplifying apparatus outputs from a connection node of the first transmission line 13 and the second transmission line 14, a signal obtained by combining the output signal of the first amplifier 11 and the output signal of the second amplifier 12.

According to the first embodiment, the amplitude balance adjusting element 15 is connected to any one of the first transmission line 13 and the second transmission line 14, thereby enabling the amplitude of the output signal of the first amplifier 11 and the amplitude of the output signal of the second amplifier 12 to be balanced. As a result, amplitude characteristics of the output power when the output signal of the first amplifier 11 and the output signal of the second amplifier 12 are combined by the first transmission line 13 and the second transmission line 14 can be improved.

A second embodiment is an example of an application of the amplifying apparatus according to the first embodiment to an LINC amplifying apparatus. The amplifying apparatus according to the first embodiment is not limited to an LINC amplifying apparatus and is applicable to an amplifying apparatus that combines for output, a signals amplified by a pair of amplifiers having identical properties. A wireless communication apparatus provided at a base station, a mobile station, and/or a relay station of a mobile communications system can be given as an example of an apparatus equipped with the amplifying apparatus according to the second embodiment.

Figure 4:
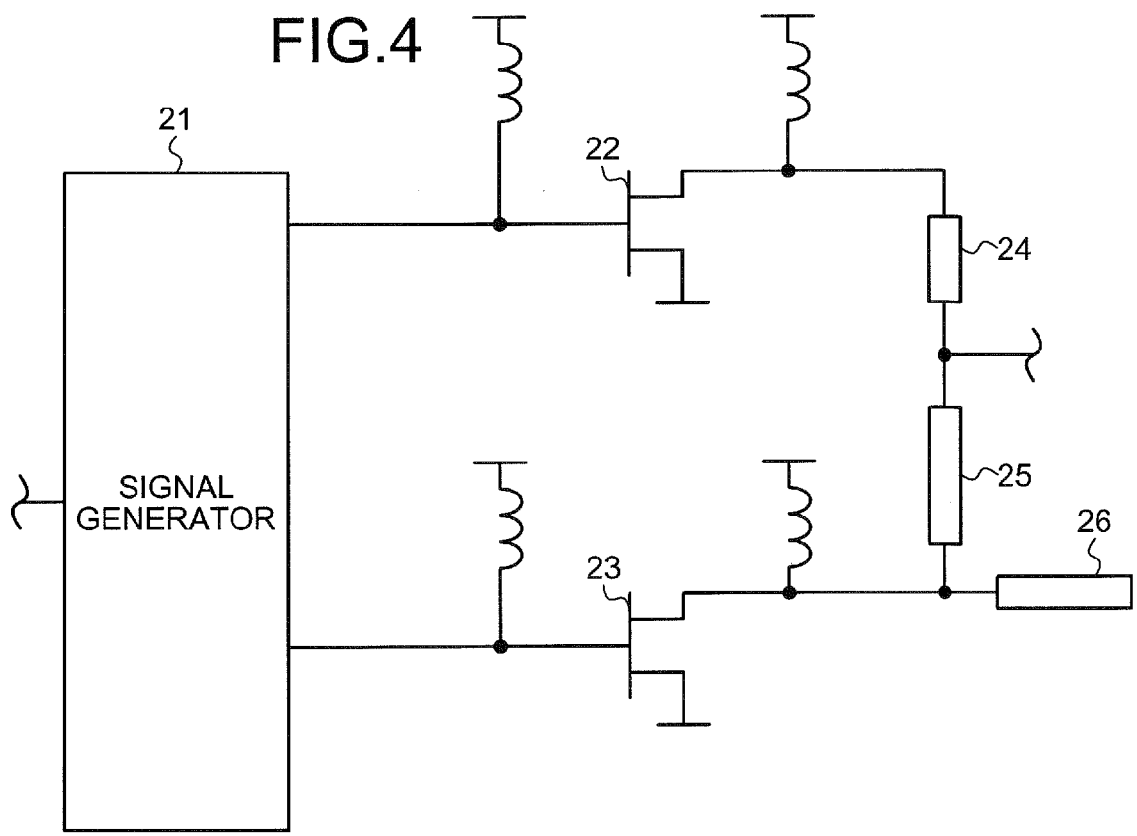
FIG. 4 is a diagram of the amplifying apparatus according to a second embodiment.

FIG. 4 is a diagram of the amplifying apparatus according to the second embodiment. As depicted in FIG. 4, the amplifying apparatus includes for example, a signal generator 21, an amplifier 22 as the first amplifier, an amplifier 23 as the second amplifier, a transmission line 24 as the first transmission line, a transmission line 25 as the second transmission line, and an open stub 26 as the amplitude balance adjusting element.

An input signal with a varying envelope is input to the signal generator 21. The input signal is a modulated signal that has been subject to amplitude modulation and phase modulation (angle modulation). The signal generator 21 separates from the input signal, a first signal and a second signal having a phase difference corresponding to the amplitude of the input signal. The first signal and the second signal are modulated signals that have been subject to phase modulation of a constant amplitude yielding a constant envelope.

The amplifier 22 and the amplifier 23 are connected to the signal generator 21. The amplifiers 22 and 23, for example, include a source grounded field effect transistor. In the field effect transistor, a gate terminal is connected to the signal generator 21 and a source terminal is grounded. Given gate and drain voltages are applied to the gate terminal and a drain terminal, respectively. The field effect transistor of the amplifier 22 and the field effect transistor of the amplifier 23 are built to have identical electrical characteristics.

The amplifier 22 amplifies the first signal, which is input to the gate terminal, and outputs the first signal from the drain terminal. The amplifier 23 amplifies the second signal, which is input to the gate terminal, and outputs the second signal from the drain terminal. The amplifiers 22 and 23, for example, may include gate ground and/or drain ground field effect transistors, or may include in place of the field effect transistor, another element having an amplifying effect.

One end of the transmission line 24 is connected to the output terminal, i.e., the drain terminal, of the amplifier 22. One end of the transmission line 25 is connected to the output terminal, i.e., the drain terminal, of the amplifier 23. The other end of the transmission line 25 is connected to the other end of the transmission line 24. The transmission line 24 and the transmission line 25 may be of differing lengths. For example, the electrical length of the transmission line 24 and the electrical length of the transmission line 25 may differ by $\lambda/4$. $\lambda$ is the wavelength of the signal transmitted by the transmission lines 24 and 25.

The amplifying apparatus outputs from the connection node of the transmission line 24 and the transmission line 25, a signal obtained by combining the output signal of the amplifier 22 and the output signal of the amplifier 23. The length of the transmission line 24 and the length of the transmission line 25 are set such that efficiency with respect to the power output from the connection node of the transmission line 24 and the transmission line 25 improves, i.e., the dynamic range of efficiency become wider.

One end of the open stub 26 is, for example, connected to the transmission line 25. The length of the open stub 26 is set such that the amplitude of the power output from the connection node of the transmission line 24 and the transmission line 25 improves, i.e., the dynamic range of the amplitude becomes wider. The open stub 26 may be connected to the transmission line 24, or an open stub may be connected to both the transmission line 24 and the transmission line 25. Further, the amplitude balance adjusting element is not limited to the open stub and suffices to be an element capable of adjusting the balance of the amplitude of the output signal of the amplifier 22 and the amplitude of the output signal of the amplifier 23.

FIGS. 5 and 6 are diagrams depicting simulation results of the amplifying apparatus according to the second embodiment. The simulation results depicted in FIG. 5 are for a case when in the amplifying apparatus depicted in FIG. 4, the electrical length of the transmission line 24 is 10 degrees; the electrical length of the transmission line 25 is 160 degrees; and the electrical length of the open stub 26 is 35 degrees. The simulation results depicted in FIG. 6 are for a case when in the amplifying apparatus depicted in FIG. 4, the electrical length of the transmission line 24 is 10 degrees; the electrical length of the transmission line 25 is 160 degrees; and the electrical length of the open stub 26 is 40 degrees.

As a simulation procedure, simulation is performed with the amplifying apparatus depicted in FIG. 4 being configured without connecting the open stub 26, the electrical length of transmission line 24 being 15 degrees, and the electrical length of the transmission line 25 being 155 degrees. The results are indicated by the efficiency curve and the output power curve depicted in FIG. 2. Although the dynamic range of the efficiency is wide, the dynamic range of the amplitude of the output power is narrow.

Next, the open stub 26 with an electrical length of 35 degrees is added to the transmission line 25; the electrical length of the transmission line 24 is set as 10 degrees; and the electrical length of the transmission line 25 is set as 160 degrees; and the effects of the addition of the open stub 26 are reduced. The simulation results are indicated by the efficiency curve and the output power curve depicted in FIG. 5. The results depicted in FIG. 5 indicate improvement in the dynamic range of the efficiency and the dynamic range of the amplitude of the output power as compared to the results depicted in FIG. 2.

Results indicated by the efficiency curve and the output power curve depicted in FIG. 6 are for a case where the open stub 26 with an electrical length of 40 degrees is added to the transmission line 25; the electrical length of the transmission line 24 is 10 degrees; and the electrical length of the transmission line 25 is 160 degrees. The results depicted in FIG. 6 indicate improvement in the dynamic range of the efficiency and the dynamic range of the amplitude of the output power as compared to the results depicted in FIG. 2. In this manner, by adding the open stub 26 of a length that increases the dynamic range of the amplitude of the output power and by finely adjusting the lengths of the transmission lines 24 and 25 after adjusting the lengths of the transmission lines 24 and 25 such that the dynamic range of the efficiency increases, the dynamic range of the efficiency and the dynamic range of the amplitude of the output power can be improved.

FIG. 7 is a diagram of an example of main parts of the amplifying apparatus according to the second embodiment. As depicted in FIG. 7, the open stub 26 is connected in series to multiple transmission lines 31, 32, and 33 and may be coupled to the transmission line 24 or the transmission line 25 by capacitance 36. Switches 34 and 35 are connected between the transmission lines 31, 32, and 33; and by switching the switches 34 and 35 off and on, the length of the open stub 26 can be adjusted.

For example, if the switch 34 is turned off, the open stub 26 becomes the transmission line 31. If the switch 34 is turned on and the switch 35 is turned off, the open stub 26 becomes the transmission lines 31 and 32. The switches 34 and 35, for example, may be diodes, bi-polar transistors, field effect transistors, or Micro Electro Mechanical System (MEMS) switches. If the switches 34 and 35 are diodes, the turning off and on of the diodes can be controlled by controlling the anode voltage of the diodes.

According to the second embodiment, the effects of the first embodiment can be achieved. Further, if the transmission line 24 or the transmission line 25 is connected to the open stub 26, the dynamic range of the amplitude can be easily adjusted as compared to a case where both the transmission line 24 and the transmission line 25 are connected to the open stub.

FIG. 8 is a diagram of the amplifying apparatus according to a third embodiment. As depicted in FIG. 8, the third embodiment is an amplifying apparatus that in place of the open stub in the second embodiment, employs as an amplitude balance adjusting element, an element that can control electrical characteristics. In the third embodiment, a variable capacitance diode 41 is employed as one example of the amplitude balance adjusting element. In place of the variable capacitance diode 41, an element that can control capacitance by the applied voltage, such as a MEMS capacitor, can be employed.

The signal output from the connection node of the transmission line 24 and the transmission line 25 is, for example, fed back to the signal generator 21 via a coupler 42. The signal generator 21 monitors the dynamic range of the amplitude of the power output from the connection node of the transmission line 24 and the transmission line 25. The signal generator 21 may monitor the dynamic range of the output power amplitude for the phase difference when a peak appears in the output power amplitude. For example, in the example depicted in FIG. 6, the signal generator 21 may monitor the dynamic range of the amplitude of the output power when the phase difference is 45 degrees.

The signal generator 21, upon detecting that the dynamic range of the amplitude has decreased, controls the bias applied to the variable capacitance diode 41, according to the extent that the dynamic range has decreased. Consequently, the capacitance of the variable capacitance diode 41 changes and similar to a case where the length of the open stub 26 is adjusted, the dynamic range of the amplitude of the power output from the connection node of the transmission line 24 and the transmission line 25 can be adjusted.

According to the third embodiment, the effects of the second embodiment can be achieved. Further, since the electrical characteristics of the amplitude balance adjusting element are controlled dynamically based on changes in the amplitude of the output power during operation of the amplifying apparatus, changes in the dynamic range of the amplitude of the output power consequent to temporal and temperature changes of the components and elements of the amplifying apparatus can be suppressed.

FIG. 9 is a diagram of the amplifying apparatus according to a fourth embodiment. As depicted in FIG. 9, the fourth embodiment is an amplifying apparatus that based on temperature changes, controls electrical characteristics such as the capacitance of the variable capacitance diode 41 and the amplitude balance adjusting element of the MEMS capacitor in the third embodiment. In the amplifying apparatus according to the fourth embodiment, a temperature detector 46 and a differential amplifier 47 are provided in place of the feedback loop of the signal output from the connection node of the transmission line 24 and the transmission line 25.

The temperature detector 46 includes a temperature detecting element, a digital to analog converter (D/A converter), and memory such as read only memory (ROM). The temperature detecting element outputs voltage according to the detected temperature. The memory preliminarily stores a temperature coefficient corresponding to the output voltage of the temperature detecting element. The D/A converter converts the temperature coefficient read out from the memory into an analog voltage signal.

The differential amplifier 47 compares the output voltage of the temperature detector 46 and a reference voltage at a preliminarily set normal temperature and outputs voltage according to the difference, as a bias to be applied to the variable capacitance diode 41. The output voltage of the differential amplifier 47 is applied to the variable capacitance diode 41, whereby the dynamic range of the amplitude of the power output from the connection node of the transmission line 24 and the transmission line 25 can be adjusted according to the temperature change, similar to cases where the capacitance of the variable capacitance diode 41 is changed and where the length of the open stub 26 is adjusted.

According to the fourth embodiment, the effects of the second embodiment can be achieved. Further, since the electrical characteristics of the amplitude balance adjusting element are controlled dynamically based on temperature changes during operation of the amplifying apparatus, changes in the dynamic range of the amplitude of the output power consequent to the temperature changes can be suppressed.

The present invention enables amplitude characteristics of output power to be improved.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifying apparatus comprising:
a first amplifier that amplifies a first signal of a constant amplitude;
a second amplifier that amplifies a second signal identical in amplitude and differing in phase with respect to the first signal;
a first transmission line of which, a first end is connected to an output terminal of the first amplifier;
a second transmission line differing in length with respect to the first transmission line and of which, a first end is connected to an output terminal of the second amplifier and a second end is connected to a second end of the first transmission line; and
an amplitude balance adjusting element that is connected to any one among the first transmission line and the second transmission line, wherein
a signal that is a combination of an output signal of the first amplifier and an output signal of the second amplifier is output from a connection node of the first transmission line and the second transmission line,
the amplitude balance adjusting element is an element that controls electrical characteristics thereof by a variation of voltage applied to the element, and
the voltage is varied according to the signal output from the connection node.

2. An amplifying apparatus comprising:
a first amplifier that amplifies a first signal of a constant amplitude;
a second amplifier that amplifies a second signal identical in amplitude and differing in phase with respect to the first signal;
a first transmission line of which, a first end is connected to an output terminal of the first amplifier;
a second transmission line differing in length with respect to the first transmission line and of which, a first end is connected to an output terminal of the second amplifier and a second end is connected to a second end of the first transmission line; and
an amplitude balance adjusting element that is connected to any one among the first transmission line and the second transmission line, wherein
a signal that is a combination of an output signal of the first amplifier and an output signal of the second amplifier is output from a connection node of the first transmission line and the second transmission line,
the amplitude balance adjusting element is an element that controls electrical characteristics thereof by a variation of voltage applied to the element,
the apparatus further comprises a temperature detector that detects temperature and outputs voltage according to the detected temperature, and
the voltage applied to the amplitude balance adjusting element is varied according to the voltage output from the temperature detector.

* * * * *